US005099156A

United States Patent [19]

Delbrück et al.

[11] Patent Number: 5,099,156

[45] Date of Patent: Mar. 24, 1992

[54] SUBTHRESHOLD MOS CIRCUITS FOR CORRELATING ANALOG INPUT VOLTAGES

[75] Inventors: Tobias Delbrück; Carver A. Mead, both of Pasadena, Calif.

[73] Assignee: California Institute of Technology, Pasadena, Calif.

[21] Appl. No.: 591,728

[22] Filed: Oct. 2, 1990

[51] Int. Cl.[5] ............ H03B 19/00

[52] U.S. Cl. ............ 307/529; 307/490; 364/819

[58] Field of Search ............ 307/201, 304, 490, 529, 307/446, 448; 364/819

[56] References Cited

U.S. PATENT DOCUMENTS

| | | | |
|---|---|---|---|
| 3,772,536 | 11/1973 | Grannis et al. | 307/448 |
| 3,839,646 | 10/1974 | Soloway | 307/448 |
| 4,345,172 | 8/1982 | Kobayashi et al. | 307/448 |
| 4,503,341 | 3/1985 | Shah | 307/448 |
| 4,739,195 | 4/1988 | Masaki et al. | 307/448 |
| 4,941,027 | 7/1990 | Beasom | 307/304 |
| 4,950,917 | 8/1990 | Holler et al. | 307/529 |
| 5,027,009 | 6/1991 | Urakawa et al. | 307/570 |

*Primary Examiner*—Stanley D. Miller

*Assistant Examiner*—Terry Cunningham

*Attorney, Agent, or Firm*—Kenneth D'Alessandro

[57] ABSTRACT

A first and a second MOS transistor of the same conductivity type are connected in series between a load and a fixed voltage source. The gates of the first and second MOS transistors are connected to sources of input voltage which are of a magnitude smaller than the threshold voltages of the two MOS transistors. The first MOS transistor located next to the load is kept in saturation. A related circuit includes a first and a second MOS transistor of the same conductivity type are connected in series between a load and a fixed voltage source. The first MOS transistor located next to the load is kept in saturation. The gates of the first and second MOS transistors are connected to the gates of third and fourth diode-connected MOS transistors of the same conductivity type as the first and second MOS transistors. The third MOS transistor is connected between a first input current node and fixed voltage source. The fourth MOS transistor is connected between a second input current node and a fixed voltage source. The third an fourth MOS transistors may alternatively be connected to first and second input transistors and a bias transistor arranged as in a differential amplifier.

12 Claims, 4 Drawing Sheets

SUBTHRESHOLD MOS CIRCUITS FOR CORRELATING ANALOG INPUT VOLTAGES

The present invention was made with support from the United States Government under Grant N00014-89-J-1675 awarded by the Department of the Navy. The United States Government has certain rights in the invention.

BACKGROUND OF THE INVENTION

1. Field of The Invention

The present invention relates to analog MOS transistor circuits. More specifically, the present invention relates to analog MOS transistor circuits useful for analog rectification and correlation of input parameters, such as voltage or current.

2. The Prior Art

Circuits are known which have the capability to correlate input parameters, such as voltage or current. A Gilbert multiplier, described in the book Analog VLSI and Neural Systems, by Carver A. Mead, Addison Wesley Publishing Co. 1989, at p. 92, is an example of such a circuit. There are also circuits which compute quadratic or gaussian similarity metrics, such as the circuit described in co-pending application serial No. 535,283, filed June 6, 1990. However, there is no circuit known to the inventors which is capable of combining the multiplication function and the gaussian similarity metric.

BRIEF DESCRIPTION OF THE INVENTION

In a first aspect of the present invention, a first and a second MOS transistor of the same conductivity type are connected in series between a load and a fixed voltage source. The gates of the first and second MOS transistors are connected to sources of input voltage which are of a magnitude smaller than the threshold voltages of the two MOS transistors. The first MOS transistor located next to the load is kept in saturation. In this specification and claims, the term "saturation" means that the drain voltage is sufficiently high that the drain current is nearly independent of drain voltage, being affected only by the shortening of the channel length (the well-known Early effect).

In a second aspect of the present invention, a first and a second MOS transistor of the same conductivity type are connected in series between a load and a fixed voltage source. The first MOS transistor located next to the load is kept in saturation. The gates of the first and second MOS transistors are connected to the gates of third and fourth diode-connected MOS transistors of the same conductivity type as the first and second MOS transistors. The third MOS transistor is connected between a first input current node and a fixed voltage source. The fourth MOS transistor is connected between a second input current node and a fixed voltage source.

In a third aspect of the present invention, instead of being connected to a fixed voltage source, the third an fourth MOS transistors are connected to first and second input transistors and a bias transistor arranged as in a differential amplifier.

In a fourth aspect of the present invention, a first and a second MOS transistor of the same conductivity type are connected in series between a load and a current summing node. The first MOS transistor located next to the load is kept in saturation. The gates of the first and second MOS transistors are connected to the gates of third and fourth MOS transistors of the same conductivity type as the first and second MOS transistors. The third MOS transistor is connected between a first input current node and the current summing node. The fourth MOS transistor is connected between a second input current node and the current summing node. A bias transistor is connected between the summing node and a fixed voltage source.

DETAILED DESCRIPTION OF A PREFERRED EMBODIMENT

Figure 1:
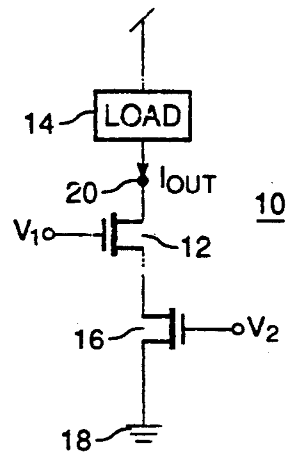
FIG. 1 is a schematic diagram of a circuit according to a first aspect of the present invention for performing a self-normalizing multiply function, where the output current is a self-normalized product of a function of the input voltages.

Referring first to FIG. 1, a self-normalizing multiply circuit 10 according to the present invention includes a first MOS transistor 12 having its drain connected to a load 14 and its source connected to the drain of a second MOS transistor 16. Suitable loads for the circuits disclosed herein include diode-connected or current-mirror connected P- or N-channel MOS transistors, diode-connected or current-mirror connected PNP or NPN bipolar transistors, linear resistors or other devices for converting a current into a voltage. The second MOS transistor 16 has its source connected to a common voltage node 18 to which $V_1$ and $V_2$ are referenced, shown as ground in FIG. 1. The gate of first MOS transistor 12 is connected to an input voltage $V_1$. the gate of the second MOS transistor 16 is connected to an input voltage $V_2$.

Both $V_1$ and $V_2$ are selected such that they are less than the threshold voltage $V_t$ of the first and second MOS transistors, which are thus operating in their subthreshold region. Also, load 14 is selected so that the drain voltage of first MOS transistor 12 is high enough above its source voltage (a few hundred millivolts) that it remains in saturation.

Under these conditions, using the well known subthreshold transistor equations disclosed in Analog VLSI and Neural Systems, the output current of the self-normalizing multiply circuit of FIG. 1, at node 20, will be defined by the following equation:

$$I_{out} = \frac{e^{V1} \times e^{V2}}{e^{V1} + e^{V2}}$$

In this equation, the voltages are in units of:

$$\frac{kT}{q\kappa}$$

Those of ordinary skill in the art will recognize this equation as a normalized product of exponentials.

Figure 2:
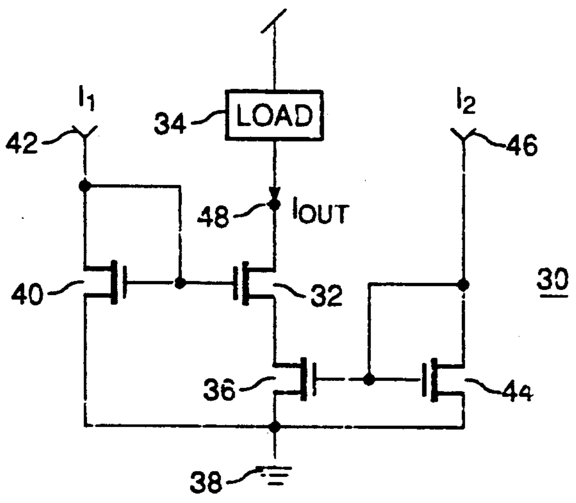
FIG. 2 is a schematic diagram of a circuit according to the present invention for performing a self-normalizing multiply function, where the output current is a self-normalized product of the two input currents.

Referring now to FIG. 2, another self-normalizing multiplier circuit 30 utilizes the two transistor circuit of FIG. 1 and includes a first MOS transistor 32 having its drain connected to a load 34 and having its source connected to the drain of a second MOS transistor 36. The second MOS transistor 36 has its source connected to a common voltage node 38, shown as ground in FIG. 2. The gate of first MOS transistor 32 is connected to the gate of a first input transistor 40 and to a first current input node 42. First input transistor 40 is connected between first current input node $I_1$ (reference numeral 42) and common voltage node 38. The gate of the second MOS transistor 36 is connected to the gate and drain of a second input transistor 44. Second input transistor 44 is connected between a second current input node $I_2$ (reference numeral 46) and common voltage node 38.

If $I_1$ and $I_2$ are such that the gate voltages $V_1$ and $V_2$ of first and second MOS transistors 32 and 36 are below the $V_t$ of the transistors, the transistors are operating in their subthreshold region. Under these conditions, and with load 34 selected so that first MOS transistor 32 remains in saturation, the output current of the self-normalizing multiply circuit of FIG. 1, at node 48, will be defined by the following equation:

$$I_{out} = \frac{I_1 \times I_2}{I_1 + I_2}$$

since $I_1$ is equal to $e^{v1}$ and $I_2$ is equal to $e^{v2}$.

Figure 3:
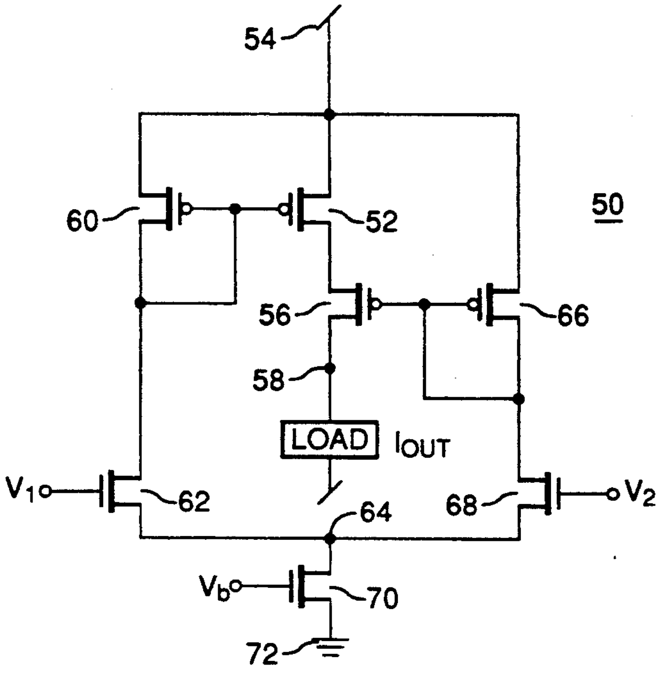
FIG. 3 is a schematic diagram of a voltage correlating circuit according to the present invention.

Referring now to FIG. 3, a voltage correlating circuit 50 according to the present invention utilizes the two transistor circuit of FIG. 2 and includes a first MOS transistor 52 of a first conductivity type having its source connected to a fixed voltage source 54, shown as the $V_{DD}$ voltage rail in FIG. 3, and having its drain connected to the source of a second MOS transistor 56 of the first conductivity type. The drain of second MOS transistor 56 is connected to an output node 58. The gate of first MOS transistor 52 is connected to the gate and drain of a third MOS transistor 60 of the first conductivity type. Transistor 60 has its source connected to fixed voltage source 54 and its drain connected the drain of a first MOS input transistor 62 of a second conductivity type. The source of first MOS input transistor 62 is connected to a node 64. The gate of first MOS input transistor 62 is connected to an input voltage $V_1$.

The gate of the second MOS transistor 56 is connected to the gate and drain of a fourth MOS transistor 66. The source of transistor 66 is connected to fixed voltage source 54 and its drain to the drain of a second MOS input transistor 68 of the second conductivity type. Second MOS input transistor 68 has its source connected to node 64. The gate of second MOS input transistor 68 is connected to an input voltage $V_2$.

A bias transistor 70 of the second conductivity type has its drain connected to node 64, common to first and second input transistors 62 and 68, and its source connected to a second fixed voltage source 72, shown as ground in FIG. 3. The gate of bias transistor 70 is connected to a source of bias voltage $V_b$.

The input to the circuit of FIG. 3 is the differential voltage $\Delta V=(V_1-V_2)$. Currents $I_1$ and $I_2$ flow through input transistors 62 and 68, respectively. The output current of the circuit of FIG. 3 is $I_{out}$ at node 58, assuming transistor 56 is saturated. The currents $I_1$ and $I_2$ through the two legs of the differential pair of transistors 62 and 68 will be comparable only when the differential input voltage $\Delta V$ is near zero. When $\Delta V$ is larger than a few units of Kt/qx, the current in one of the two legs will shut off. The circuit of FIG. 3 computes the function:

$$I_{out} = \frac{k(I_1 \times I_2)}{I_1 + I_2}$$

which is zero whenever either $I_1$ or $I_2$ is zero. The multiplier k is the ratio W/l of the sizes of transistors 52 and 56 to transistors 60, 62, 66, and 68 and is unity if all of the transistors are the same size.

Figure 4:
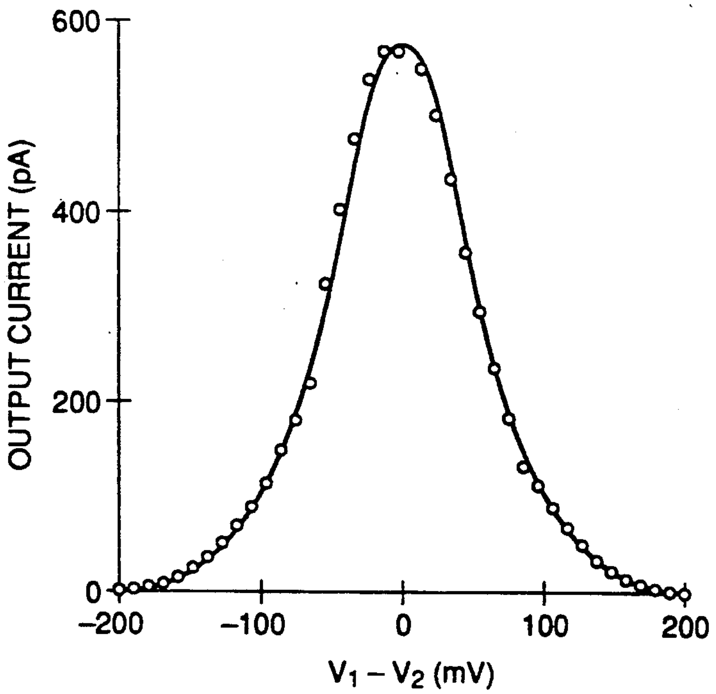
FIG. 4 is a graph showing the output current of the circuit of FIG. 3 as a function of the differential input voltage.

The output of the circuit is a bell shaped curve centered on $\Delta V=0$ with a maximum height of $KI_b/2$, where $I_b$ is the current through bias transistor 70. A typical curve is shown in FIG. 4.

Figure 5:
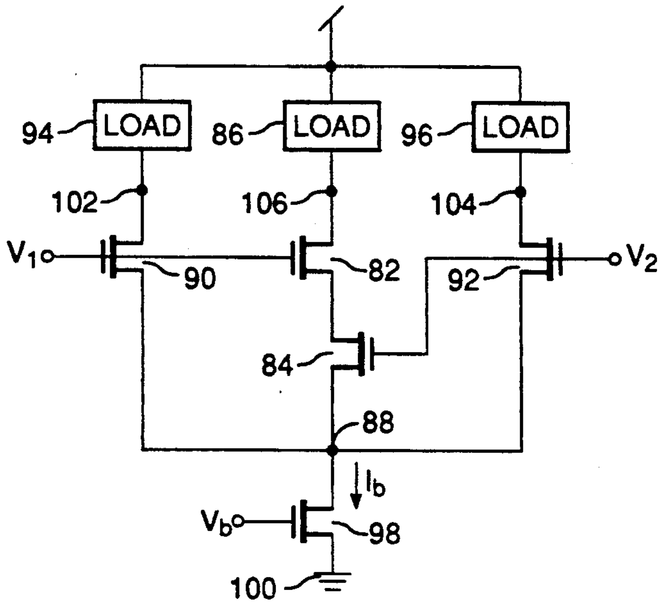
FIG. 5 is a schematic diagram of a voltage correlator circuit according to a presently preferred embodiment of the invention.

A presently preferred embodiment of a voltage correlator rectifier according to the invention is shown in FIG. 5. In the voltage correlator rectifier circuit 80 of FIG. 5, first and second MOS transistors 82 and 84 correspond to the two-transistor circuit of FIG. 1. First MOS transistor 82 has its drain connected to a first load 86 and its source connected to the drain of second MOS transistor 84. Second MOS transistor 84 has its source connected to a node 88. The gate of first MOS transistor 82 is connected to an input voltage $V_1$, and to the gate of a third MOS transistor 90. The gate of second MOS transistor 84 is connected to an input voltage $V_2$, and to the gate of a fourth MOS transistor 92.

Third MOS transistor 90 has its drain connected to a second load 94 and its source connected to node 88. Fourth MOS transistor 92 has its drain connected to a third load 96 and its source connected to node 88. An MOS bias transistor 98 has its drain connected to node 88 and its source connected to a source of fixed voltage 100. The gate of bias transistor 98 is connected to a bias voltage $V_b$.

The three currents $I_1$ (at node 102), $I_2$ (at node 104) and $I_{out}$ (at node 106) must sum to the bias current $I_b$ flowing through bias transistor 98. Hence, the voltage $V_c$ at node 88 will follow the higher of $V_1$ or $V_2$. $V_c$ will lag behind the higher of $V_1$ or $V_2$ by about Vb. When the differential input voltage $\Delta V=0$, there will be current flowing through all three nodes 102, 104, and 106. In particular, $I_{out}$ will, take on a finite value. When $|\Delta V|$ is larger than a few units of Kt/qk, the common node voltage $V_c$ will start to follow the higher of $V_1$ or $V_2$. This action will shut off $I_{out}$ because one of the transistors 82 or 84 (the one whose gate is connected to the lower of $V_1$ or $V_2$) will shut off. Both $V_1$ and $V_2$ can rise together and $I_{out}$ will not increase, because the common node voltage $V_c$ at node 88 will rise along with $V_1$ and $V_2$, holding $I_{out}$ constant.

The form of the response may be computed using the transistor law for subthreshold operation:

$$I_{ds}=we^{kV_g}(e^{-V_s}-e^{-V_d})$$

where $I_{ds}$ is the current from drain to source, w the effective strength of transistors 82 and 84 relative to that of transistors 90 and 92, $V_g$ is the gate voltage, $V_s$ is the source voltage, and $V_d$ is the drain voltage. All of these voltages are relative to the bulk and are measured in units of kT/q. The factor $k \approx 0.7$ accounts for the back-gate or body effect. All pre-exponential parameters have been absorbed into w. The current $I_{out}$ through transistors 82 and 84 may be calculated as:

$$I_{out} = we^{-V_c} \times \frac{e^{\kappa V_1} \times e^{\kappa V_2}}{e^{\kappa V_1} + e^{\kappa V_2}}$$

Using this expression and the fact that $$I_b=I_1+I_{out}+I_2$$

the equation for $I_{out}$ may be restated as:

$$I_{out} = \frac{1}{1 + \frac{4}{w}\cosh^2\left(\frac{\kappa \Delta V}{2}\right)}$$

The W:L ratios of transistors 82 and 84 controls the fraction of the bias current $I_b$ that is supplied by $I_{out}$ when $\Delta V=0$, and hence the width of the response in voltage units. The width of the $I_{out}$ hump will scale approximately as log w when $w>>I$, as can be seen from an examination of the denominator of the $I_{out}$ equation.

Figure 6:
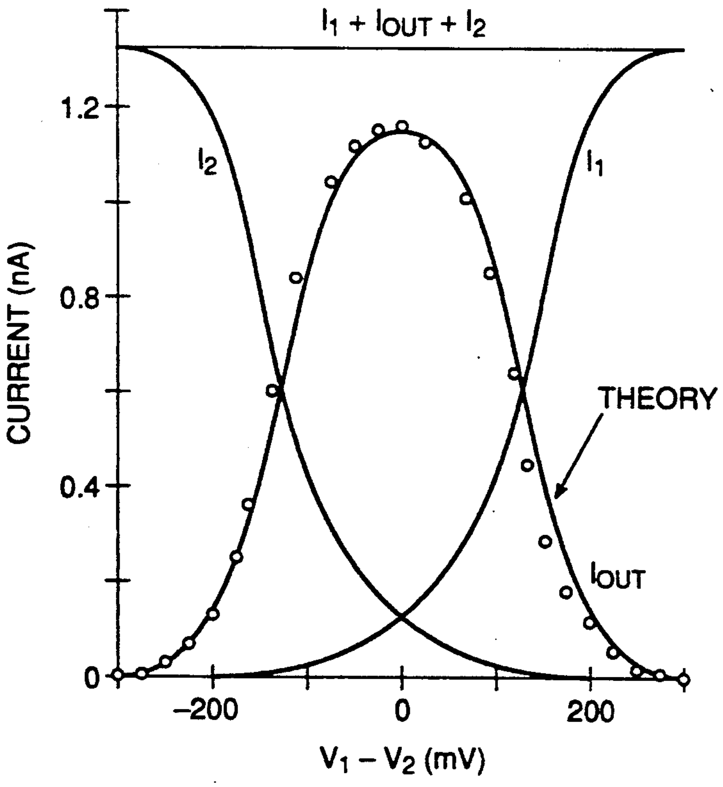
FIG. 6 is graph of the current in the two differential legs and the output current of the circuit of FIG. 5.

FIG. 6 is a graph showing a representative set of operating curves for the circuit of FIG. 5, showing $I_1$, $I_2$, and $I_{out}$ as a function of $\Delta V=(V_1-V_2)$. As can clearly be seen from FIG. 6, because the output spread is greater than the offset voltages likely to be encountered in typical MOS circuits, the circuit of FIG. 5 may easily be used as a "less-than, equal-to or greater-than circuit" which compares the input voltages $V_1$ and $V_2$. $I_{out}$ is greatest when $V_1=V_2$, $I_2$ is greatest when $V_1>V_2$, and $I_1$ is greatest when $V_1<V_2$. The spread of the three curves of FIG. 6 is controlled by controlling the size ratios of transistors 82 and 84 relative to the other transistors in the circuit. From the curves of FIG. 6, those of ordinary skill in the art will recognize that the analog circuit of FIG. 5 may be used as both a similarity indicator and as a sigmoid function in a neural network.

Figure 7:
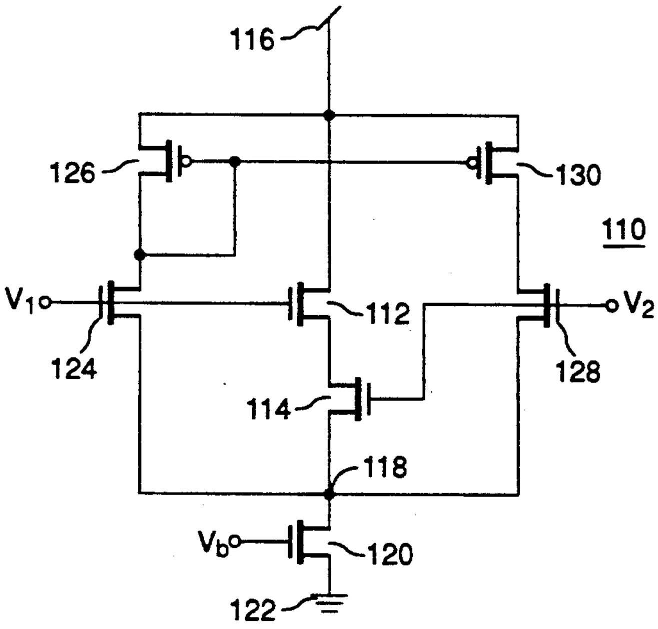
FIG. 7 is a schematic diagram of a circuit according to the present invention which is a variation of the circuit of FIG. 5.

The circuit of FIG. 7 is an extension of the circuit of FIG. 5 using a current mirror to produce an output consisting of the difference current $I_{out}=I_1-I_2$. Correlator circuit 110 includes first and second MOS transistors 112 and 114, connected like the transistors in the circuit of FIG. 1 except that MOS transistor 112 is connected to a first fixed voltage source 116, shown as $V_{DD}$ in FIG. 7, and MOS transistor 114 is connected to a node 118. An MOS bias transistor 120 is connected between node 118 and a second fixed voltage source 122, shown as ground in FIG. 7.

The gate of first MOS transistor 112 is connected to the gate of a third MOS transistor 124. Third MOS transistor 124 is connected between node 118 and a fourth MOS transistor 126. Fourth MOS transistor 126 is connected to first fixed voltage source 116.

The gate of second MOS transistor 114 is connected to the gate of a fifth MOS transistor 128. Fifth MOS transistor 128 is connected between node 118 and a sixth MOS transistor 130. Sixth MOS transistor 128 is connected to first fixed voltage source 116. The gates of fourth and sixth MOS transistors 126 and 130 are connected together and to the node joining third and fourth MOS transistors 124 and 126, forming a current mirror.

Figure 8:
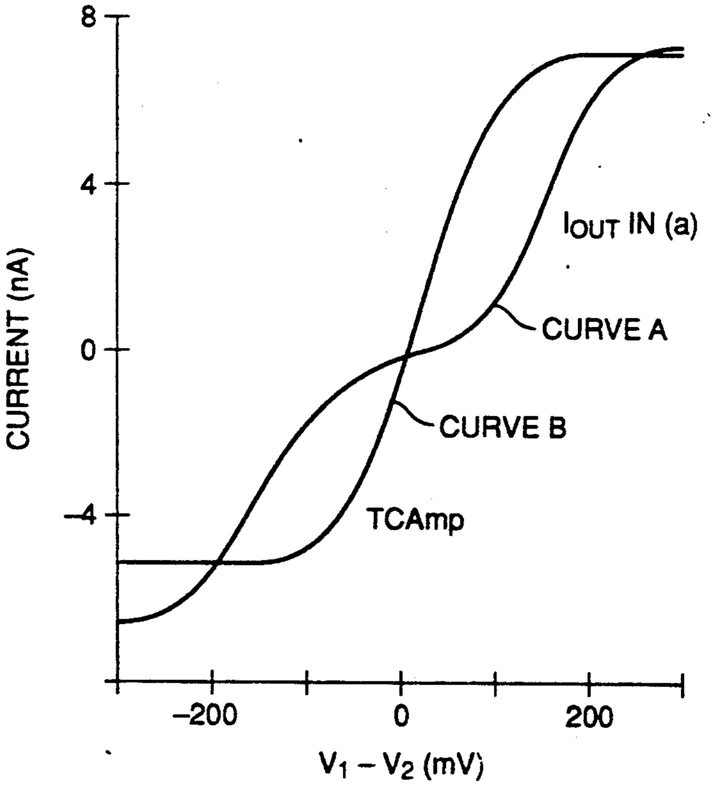
FIG. 8 is graph of the output current from the circuit of FIG. 7 compared to the output of a conventional transconductance amplifier.

The characteristic curve of the circuit of FIG. 7 is shown in the graph of FIG. 8 as curve A. A characteristic curve from a conventional transconductance amplifier is superimposed as curve B of FIG. 8 for comparison. Those of ordinary skill in the art will recognize that the curves are similar except for the flattened region in curve A which occurs in the region around where $\Delta V=0$. Those of ordinary skill in the art will recognize that this flattening of the curve A in this region serves to dede-emphasize the offset voltages encountered in MOS transistor circuits.

While a presently preferred embodiment of the invention has been disclosed, those of ordinary skill in the art will recognize that other embodiments also fall within the scope of the invention. For example, although the disclosed embodiments show particular conductivity types of MOS transistors, those of ordinary skill will readily be able to substitute MOS transistors of the opposite conductivity types and with appropriate reversing of the power supply polarities, will achieve circuits which, although not explicitly shown in the figures, plainly come within the scope of the claims.

What is claimed is:

1. An integrated circuit for correlating two inputs, including:

a first current input node;

a first MOS transistor of a selected conductivity type having first and second main terminals and a control terminal, the control terminal of said first MOS transistor connected to said first current input node, said first MOS transistors having a threshold voltage;

a second current input node;

a second MOS transistor of said selected conductivity type having first and second main terminals and a control terminal, the control terminal of said second MOS transistor connected to said second current input node, the first main terminal of said second MOS transistor connected to the second main terminal of said first MOS transistor, said second MOS transistor having a threshold voltage substantially equal to the threshold voltage of said first MOS transistor;

a common fixed voltage node connected to the second main terminal of said second MOS transistor;

a third MOS transistor of said selected conductivity type having first and second main terminals and a control terminal, the first main terminal and said control terminal connected to said first current input node, the second main terminal of said third MOS transistor connected to said common voltage node;

a fourth MOS transistor of said selected conductivity type having first and second main terminals and a control terminal, the first main terminal and said control terminal connected to said second current input node, the second main terminal of said fourth MOS transistor connected to said common voltage node;

load means connected between a fixed voltage source and the first main terminal of said first MOS transistor, for supplying a current to maintain said first MOS transistor in saturation;

at least one of said input current nodes having a current flowing through it of a magnitude such that either said first of said second MOS transistor has a voltage less than its threshold voltage on its control terminal relative to said common node.

2. The integrated circuit of claim 1 wherein said load means is a diode-connected MOS transistor.

3. The integrated circuit of claim 1 wherein said load means is a diode-connected bipolar transistor.

4. An integrated voltage correlating circuit, including:

a first voltage input node;

a second voltage input node;

a first MOS transistor of a first conductivity type having first and second main terminals and a control terminal;

a second MOS transistor of said first conductivity type having a first main terminal connected to the second main terminal of said first MOS transistor, a second main terminal connected to a first fixed voltage source, and a control terminal;

a third MOS transistor of said first conductivity type having a first main terminal, a second main terminal connected to said first fixed voltage source, and a control terminal connected to the control terminal of said first MOS transistor;

a fourth MOS transistor of said first conductivity type having a first main terminal, a second main terminal connected to said first fixed voltage source, and a control terminal connected to the control terminal of said second MOS transistor;

a first MOS transistor of a second conductivity type having a first main terminal connected to the first main terminal and control terminal of said third MOS transistor of said first conductivity type, a second main terminal connected to a common node, and a control terminal connected to said first voltage input node;

a second MOS transistor of said second conductivity type having a first main terminal connected to the first main terminal and control terminal of said fourth MOS transistor of said first conductivity type, a second main terminal connected to said common node, and a control terminal connected to said second voltage input node;

a third MOS transistor of said second conductivity type having a first main terminal connected to said common node, a second main terminal connected to a second source of fixed voltage, and a control terminal connected to a source of bias voltage; and load means connected between a third fixed voltage source and the first main terminal of said MOS transistor, for supplying a current to maintain said first MOS transistor in saturation.

5. The integrated circuit of claim 4 wherein said load means is a diode-connected MOS transistor.

6. The integrated circuit of claim 4 wherein said load means is a diode-connected bipolar transistor.

7. An integrated circuit for correlating two inputs, including:

a first voltage input node;

a first MOS transistor of a selected conductivity type having a first main terminal, a second main terminal, and a control terminal connected to said first voltage input node, said first MOS transistor having a threshold voltage;

a first load connected between said first main terminal of said first MOS transistor and a first fixed voltage source, said first load chosen to pass sufficient current to maintain said first MOS transistor in saturation;

a second voltage input node;

a second MOS transistor of said selected conductivity type having a first main terminal connected to the second main terminal of said first MOS transistor, a second main terminal, and a control terminal connected to said second voltage input node, said second MOS transistor having a threshold voltage substantially equal to the threshold voltage of said first MOS transistor;

a common voltage node connected to the second main terminal of said second MOS transistor;

a third MOS transistor of said selected conductivity type having a fist main terminal, a second main terminal connected to said common node, and a control terminal connected to said first voltage input node;

a second load connected between said first main terminal of said third MOS transistor and said first fixed voltage;

a fourth MOS transistor of said selected conductivity type having a first main terminal, a second main terminal connected to said common node, and a control terminal connected to said second voltage input node;

a third load connected between said first main terminal of said fourth MOS transistor and said first fixed voltage; and a fifth MOS transistor of said selected conductivity type having a first main terminal connected to said common node, a second main terminal connected to a second fixed voltage source, and a control terminal connected to a source of bias voltage.

8. The integrated circuit of claim 7 wherein said first, second, and third loads are diode-connected MOS transistors.

9. The integrated circuit of claim 7 wherein said first, second, and third loads are diode-connected bipolar transistors.

10. The integrated circuit for comparing two inputs, including:

a first voltage input node;

a first MOS transistor of a first conductivity type having a first main terminal connected to a first fixed voltage source, said first MOS transistor also having a control terminal connected to said first voltage input node and a second main terminal, said first MOS transistor having a threshold voltage, a second voltage input node;

a second MOS transistor of said first conductivity type having a first main terminal connected to the second main terminal of said first MOS transistor, a second main terminal, and a control terminal connected to said second voltage input node, said second MOS transistor having a threshold voltage substantially equal to the threshold voltage of said first MOS transistor;

a common node connected to the second main terminal of said second MOS transistor;

a third MOS transistor of said first conductivity type having a first main terminal, a second main terminal connected to said common node, and a control terminal connected to said first voltage input node;

a fourth MOS transistor of said first conductivity type having a first main terminal, a second main terminal connected to said common node, and a control terminal connected to said second voltage input node;

a fifth MOS transistor of said first conductivity type having a first main terminal connected to said common node, a second main terminal connected to a second fixed voltage source, and a control terminal connected to a source of bias voltage;

a first MOS transistor of a second conductivity type, having a first main terminal and a control terminal connected together to the first main terminal of said third MOS transistor of said first conductivity type, and a second main terminal connected to said first fixed voltage source;

a second MOS transistor of a second conductivity type, having a first main terminal connected to the first main terminal of said fourth MOS transistor of said first conductivity type, a control terminal connected to the control terminal of said first MOS transistor of said second conductivity type and a second main terminal connected to said first fixed voltage source.

11. An integrated circuit for correlating two inputs, including:

a first MOS transistor of a selected conductivity type having first and second main terminals and a control terminal, said first MOS transistor having a threshold voltage;

a second MOS transistor of said selected conductivity type having first and second main terminals and a control terminal, the first main terminal of said second MOS transistor being connected to the second main terminal of said first MOS transistor, said second MOS transistor having a threshold voltage;

a first fixed voltage source connected to the second main terminal of said second MOS transistor;

a first source of input voltage connected to the control terminal of said first MOS transistor, said first source of input voltage having a magnitude less than the threshold voltage of said first MOS transistor;

a second source of input voltage connected to the control terminal of said second MOS transistor, said second source of input voltage having a magnitude less than the threshold voltage of said second MOS transistor; and a diode-connected MOS transistor connected between a second fixed voltage source and the first main terminal of said first MOS transistor, the magnitude of said second fixed voltage source chosen to maintain said first MOS transistor in saturation.

12. An integrated circuit for correlating two inputs, including:

a first MOS transistor of said selected conductivity type having first and second main terminals and a control terminal, said first MOS transistor having a threshold voltage;

a second MOS transistor of said selected conductivity type having first and second main terminals and a control terminal, the first main terminal of said second MOS transistor being connected to the second main terminal of said first MOS transistor, said second MOS transistor having a threshold voltage;

a first fixed voltage source connected to the second main terminal of said second MOS transistor;

a first source of input voltage connected to the control terminal of said first MOS transistor, said first source of input voltage having a magnitude less than the threshold voltage of said first MOS transistor;

a second source of input voltage connected to the control terminal of said second MOS transistor, said second source of input voltage having a magnitude less than the threshold voltage of said second MOS transistor; and a diode-connected bipolar transistor connected between a second fixed voltage source and the first main terminal of said first MOS transistor, the magnitude of said second fixed voltage source chosen to maintain said first MOS transistor in saturation.

* * * * *